(12) United States Patent
Cremonesi et al.

(10) Patent No.: US 7,419,876 B2
(45) Date of Patent: Sep. 2, 2008

(54) METHOD FOR MANUFACTURING NON-VOLATILE MEMORY DEVICES INTEGRATED IN A SEMICONDUCTOR SUBSTRATE

(75) Inventors: Carlo Cremonesi, Vaprio d'Adda (IT); Alessandro Grossi, Milan (IT); Giulio Albini, Giussano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 407 days.

(21) Appl. No.: 11/319,798

(22) Filed: Dec. 27, 2005

(65) Prior Publication Data

US 2006/0183281 A1    Aug. 17, 2006

(30) Foreign Application Priority Data

Dec. 28, 2004    (IT)    ................... MI2004A002533

(51) Int. Cl.
*H01L 21/336* (2006.01)
(52) U.S. Cl. ................ 438/258; 438/595; 257/E21.689
(58) Field of Classification Search ................ 438/201, 438/211, 258, 595; 257/E21.681, E21.683, 257/E21.689
See application file for complete search history.

(56) References Cited

U.S. PATENT DOCUMENTS 6,274,411 B1 *    8/2001    Patelmo et al. .............. 438/266
6,798,015 B2 *    9/2004    Kasuya ....................... 438/258

* cited by examiner

*Primary Examiner*—Chandra Chaudhari
(74) *Attorney, Agent, or Firm*—Lisa K. Jorgenson; Robert Iannucci; Seed IP Law Group PLLC

(57) ABSTRACT

A method manufactures non-volatile memory devices integrated on a semiconductor substrate and including a matrix of non-volatile memory cells and associated circuitry. The manufacturing method includes: forming a plurality of electrodes of the matrix memory cells, each electrode including a first dielectric layer, a first conductive layer, a second dielectric layer and a second conductive layer; and forming a plurality of electrodes of transistors of the circuitry each including a first dielectric layer and a first conductive layer. The method also includes forming first coating spacers on the side walls of the gate electrodes of the memory cell and second coating spacers on the side walls of the gate electrodes of the circuitry, the second spacers being wider than the first spacers.

17 Claims, 6 Drawing Sheets

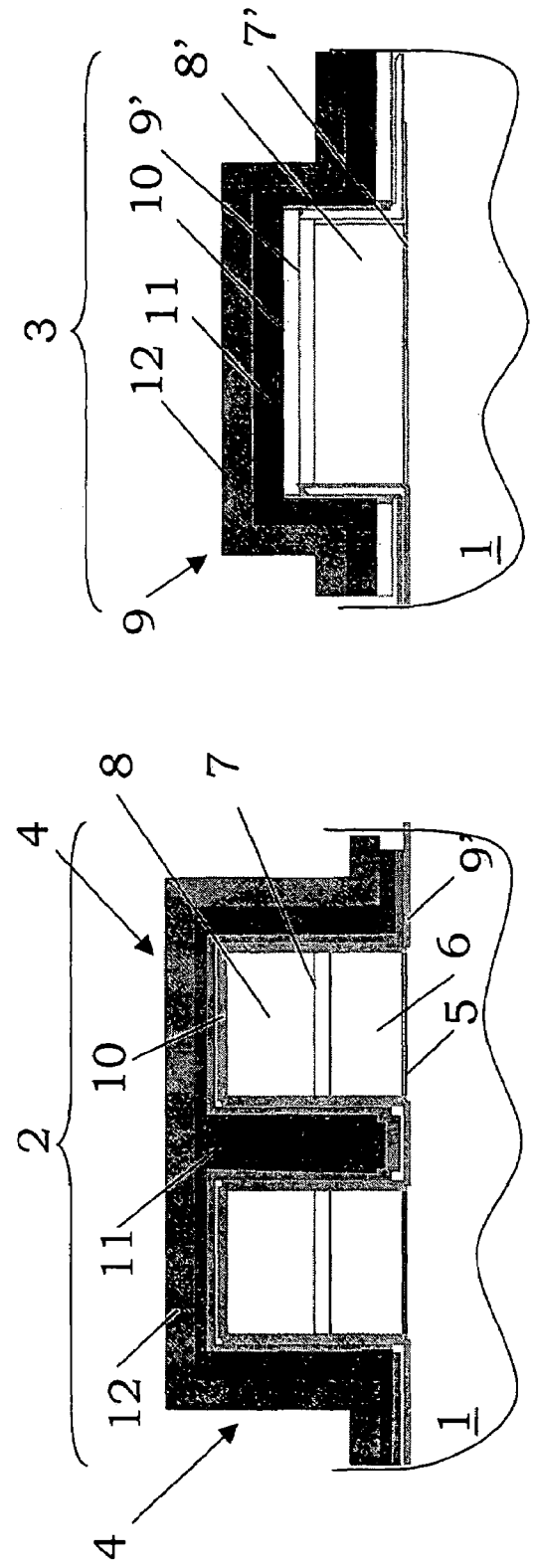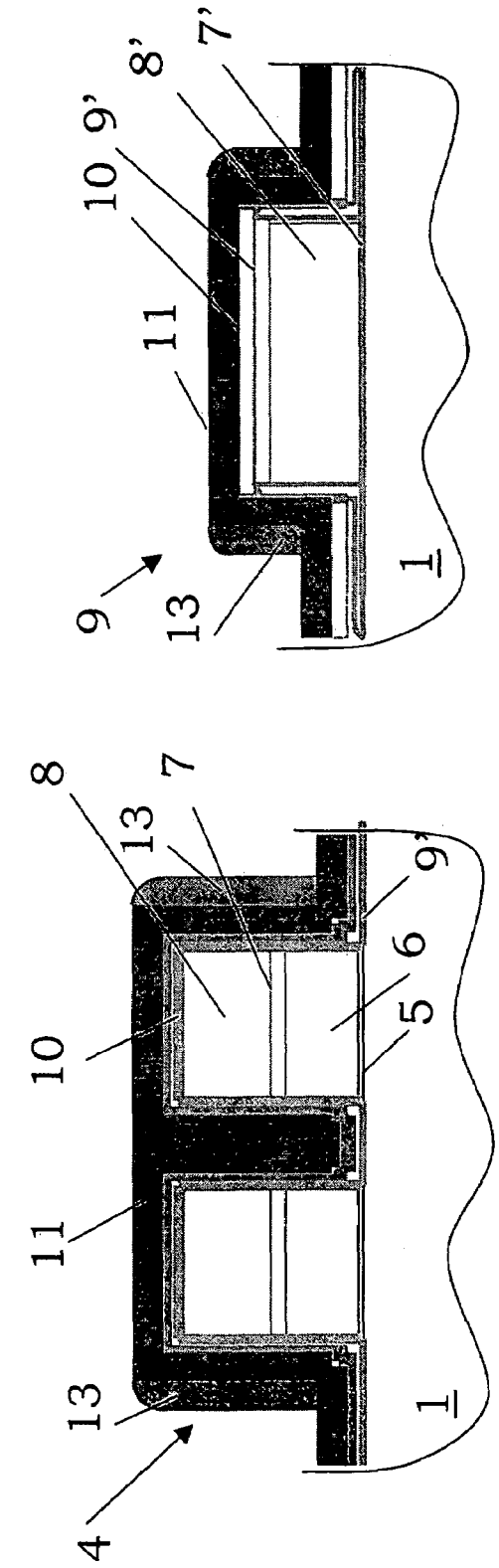
Fig. 1 (Prior Art)
Fig. 2 (Prior Art)

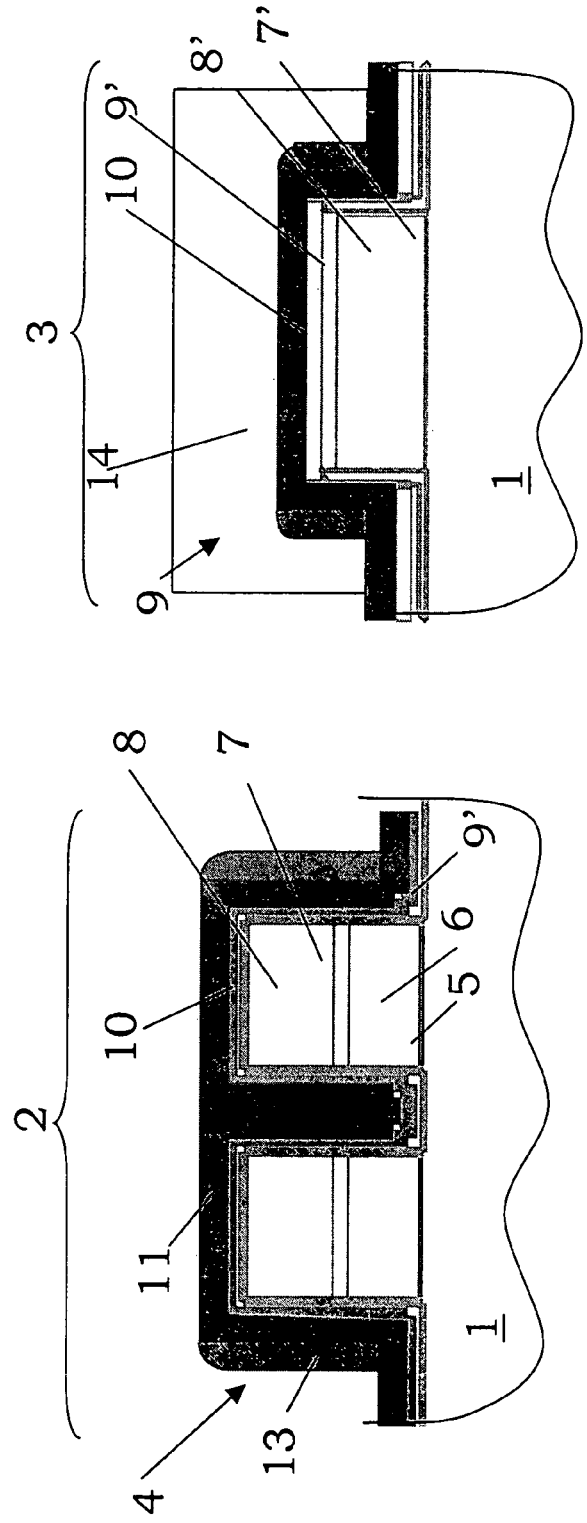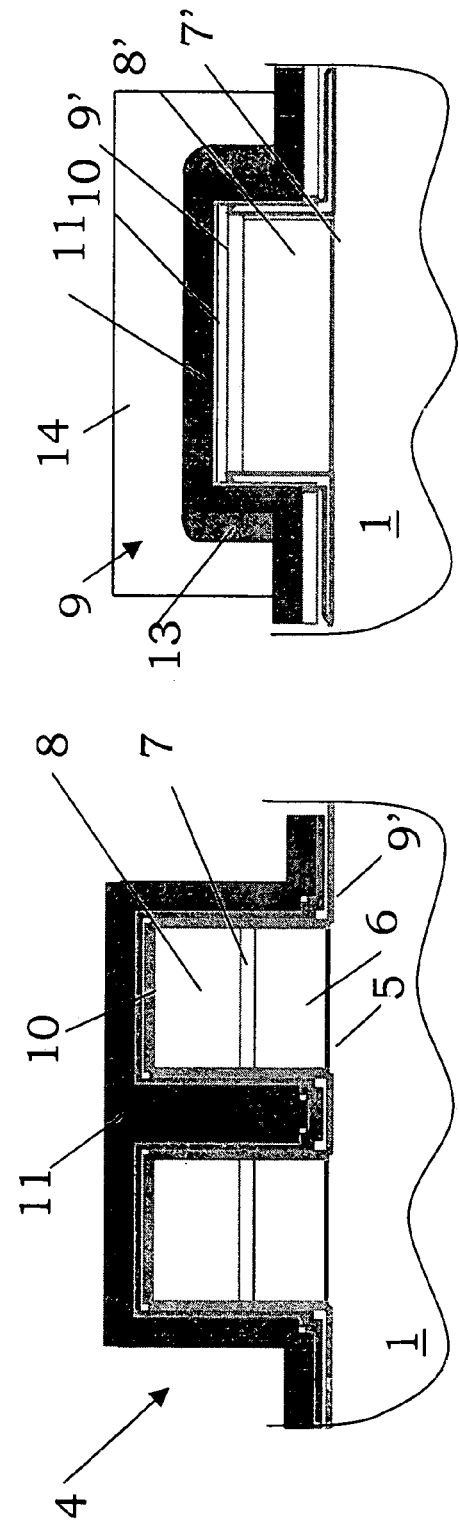
Fig. 3 (Prior Art)
Fig. 4 (Prior Art)

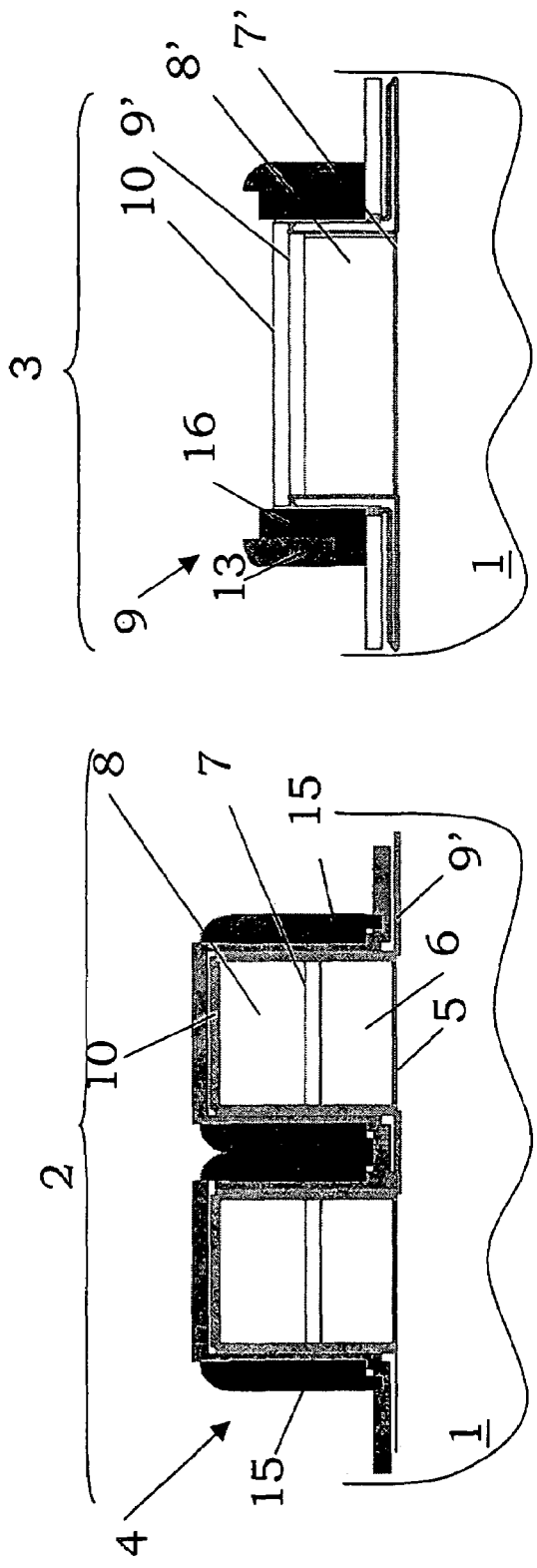
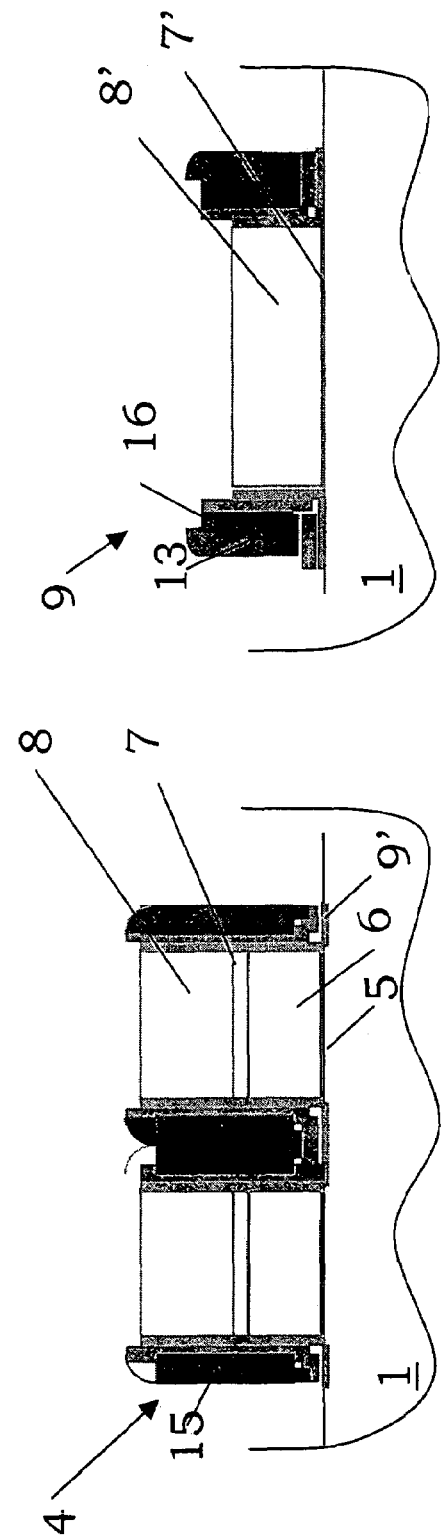
Fig. 5 (Prior Art)
Fig. 6 (Prior Art)

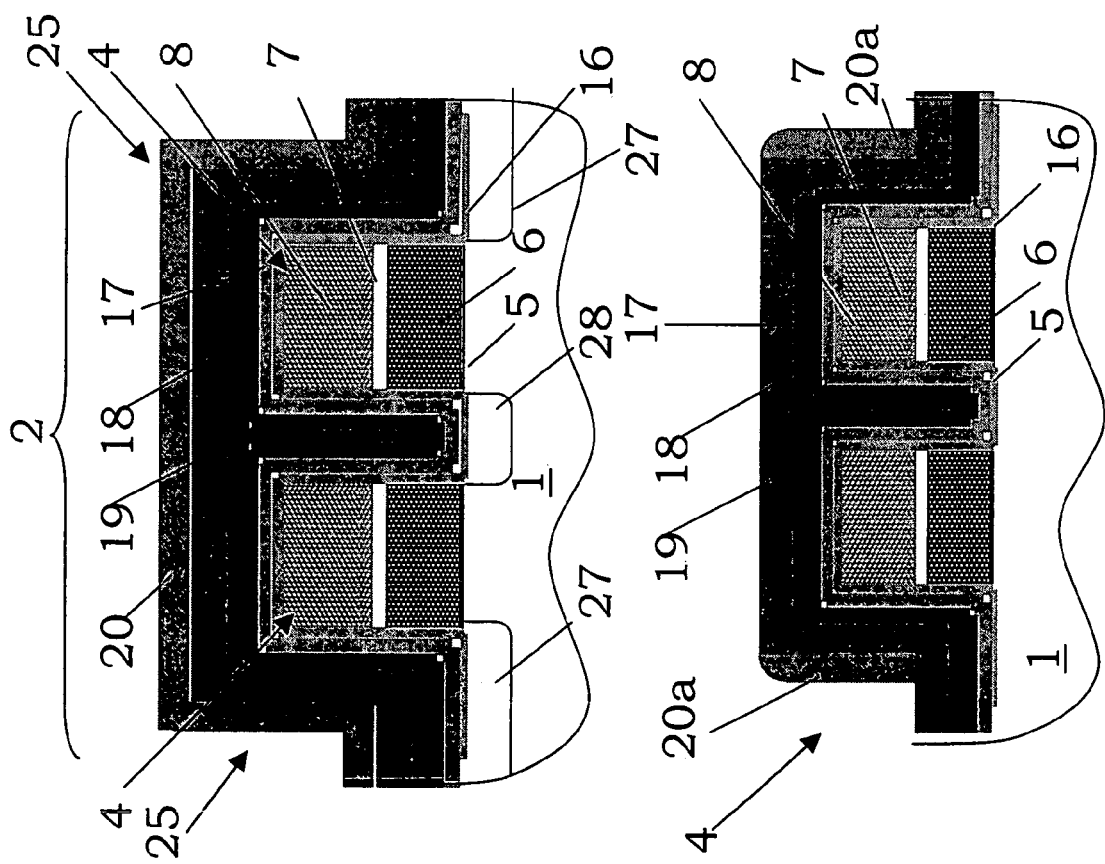

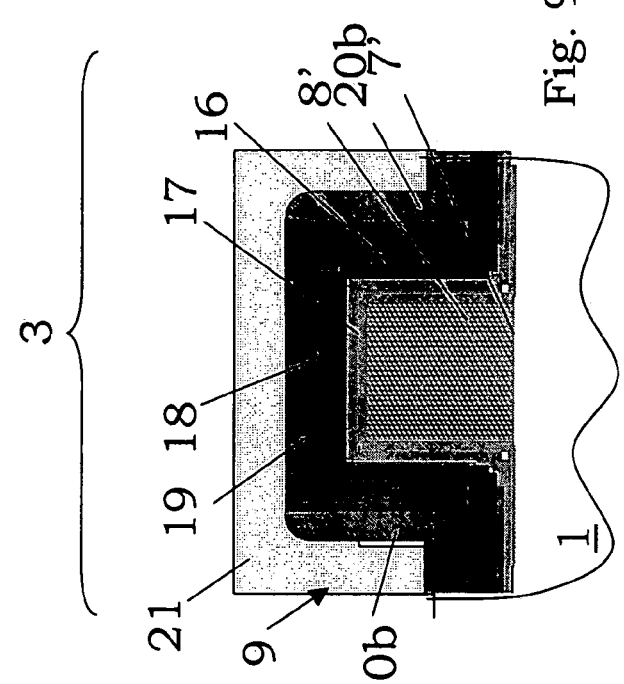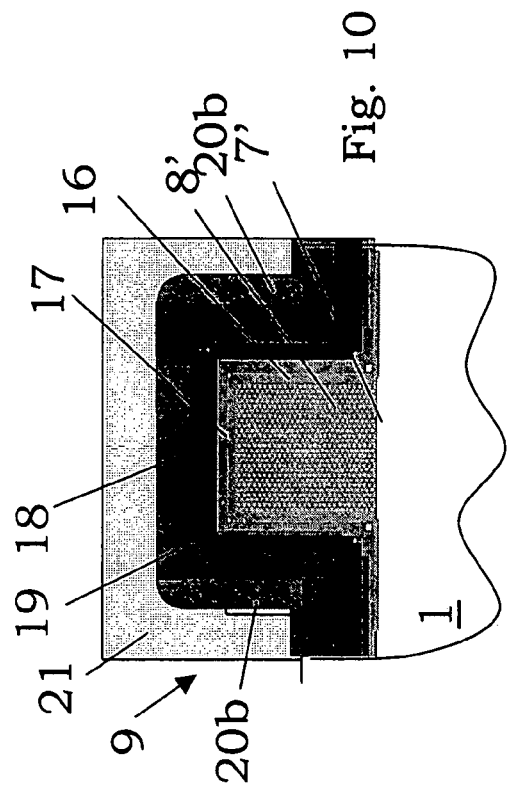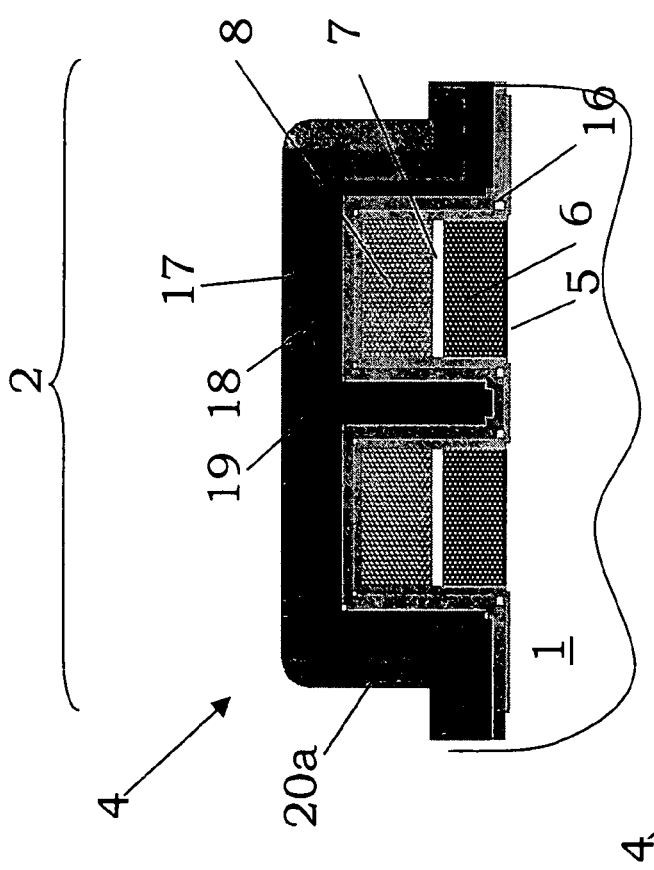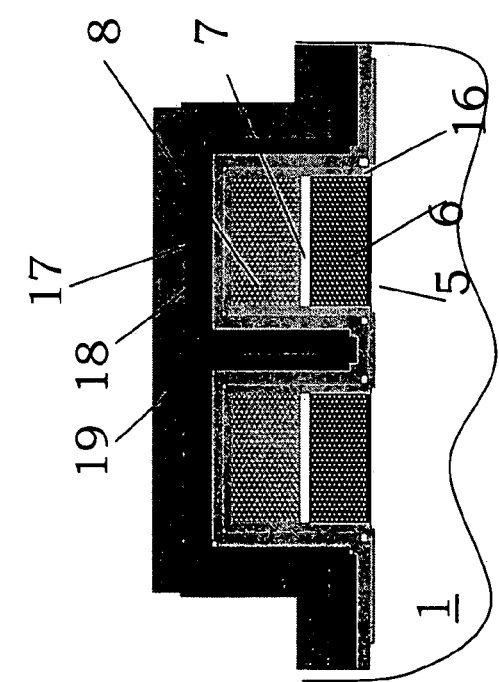

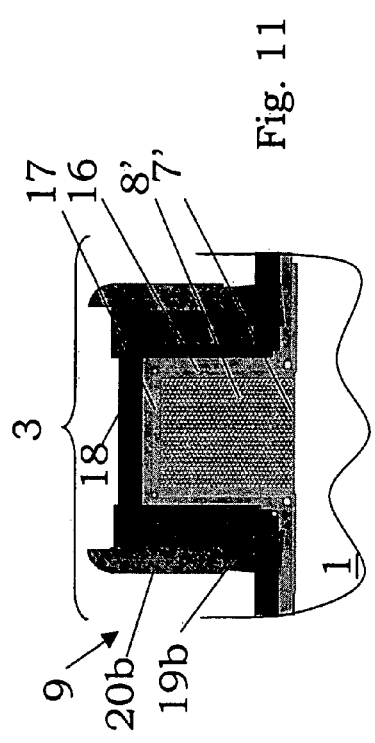
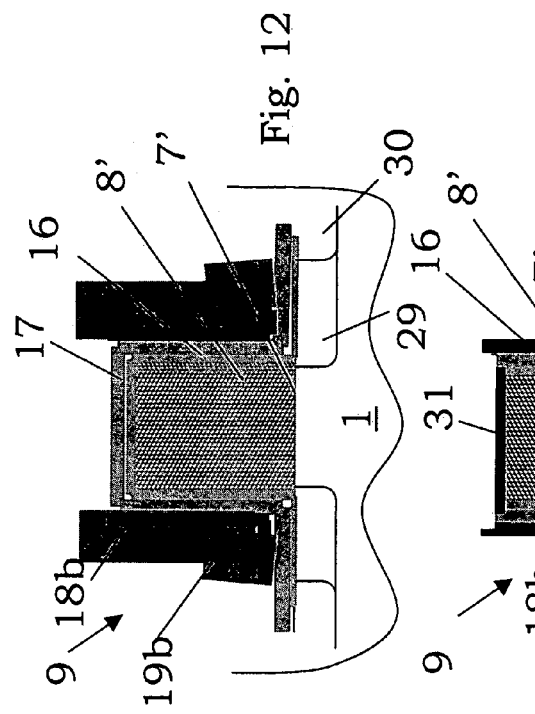
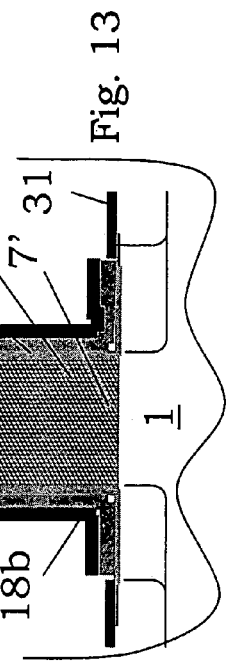
Fig. 11
Fig. 12
Fig. 13
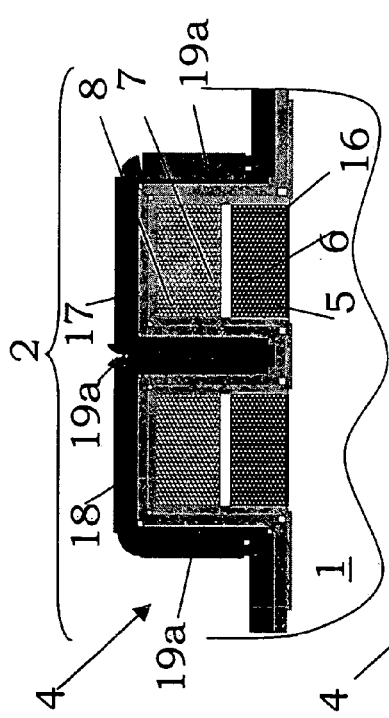
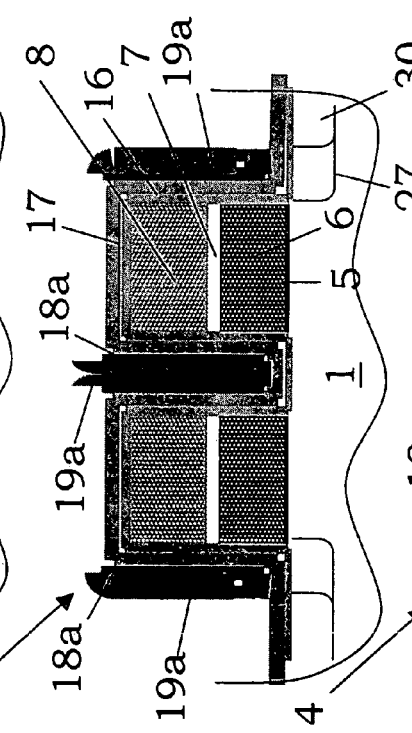
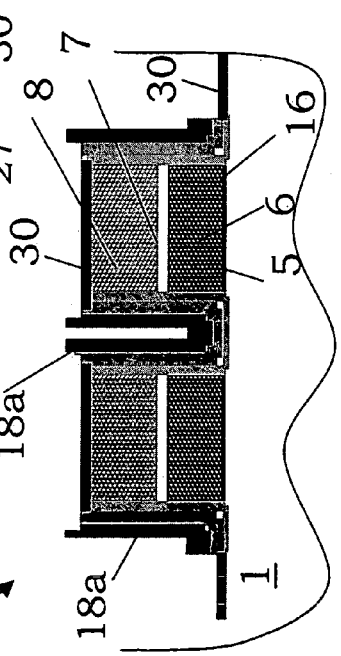

METHOD FOR MANUFACTURING NON-VOLATILE MEMORY DEVICES INTEGRATED IN A SEMICONDUCTOR SUBSTRATE

BACKGROUND OF THE INVENTION

1. Field of the Invention

The present invention relates to a method for manufacturing non-volatile memory devices integrated on a semiconductor substrate.

More specifically, the invention relates to a method for manufacturing non-volatile memory devices integrated on a semiconductor substrate comprising a matrix of non-volatile memory cells and associated circuitry, the manufacturing method comprising the following steps:

- forming a plurality of gates of the matrix memory cells, comprising a first dielectric layer, a first conductive layer, a second dielectric layer and a second conductive layer,
- forming a plurality of gates of high voltage (HV) transistors of said circuitry,
- coating, with at least one protection dielectric layer, said gates of the matrix and of the circuitry.

The invention particularly, but not exclusively, relates to a method for realizing spacers of different lengths in memories of the EPROM, EEPROM, flash EEPROM type and the following description is made with reference to this field of application by way of illustration only.

2. Description of the Related Art

As it is well known, non-volatile memory electronic devices, for example of the EPROM and Flash EEPROM type, integrated on semiconductor, comprise a plurality of non-volatile memory cells organized in a matrix.

Each single non-volatile memory cell comprises a MOS transistor having a gate electrode, arranged above the channel region, that is floating, i.e., it as a high impedance in DC towards all the other terminals of the same cell and of the circuit wherein the cell is inserted. Generally, this floating gate electrode is realized by means of a polysilicon layer.

The cell also comprises a second electrode, called control gate electrode, which is capacitively coupled to the floating gate electrode through an intermediate dielectric layer, so called interpoly. Generally, the control electrode is realized by means of a polysilicon layer. This second electrode is driven through suitable control voltages. The other terminals of the transistor are the usual drain and source regions.

The matrix of memory cells is associated with control circuitry comprising a plurality of MOS transistors, each comprising a source region and a drain region separated by a channel region. A gate electrode is then formed on the channel region and insulated therefrom by means of a gate oxide layer. Moreover, insulating spacers are provided on the side walls of the gate electrode.

However, in new generation memory devices, in the circuitry associated with the memory matrix both MOS HV transistors suitable to sustain high voltages and MOS low voltage (LV) transistors suitable to sustain low voltages are integrated, which, together with the memory cells, have different specifications for the realization of the spacers.

To make the problems related to the realization of these spacers clearer, the known process steps are now described to form differential spacers in a conventional memory device comprising a matrix 2 of non-volatile memory cells and associated circuitry 3 comprising both HV transistors suitable to sustain high voltages and LV transistors suitable to sustain low voltages.

With reference to FIGS. 1 to 5, a portion of a semiconductor substrate 1 is shown where the memory cells of the memory matrix 2 and the HV transistors of the circuitry 3 are realized, while the portion of a semiconductor substrate 1 where the LV transistors are realized is not shown.

In particular, as shown in FIG. 1 on a semiconductor substrate 1 after having defined active areas for the memory matrix 2 and for the circuitry 3, in the memory matrix 2 a plurality of floating gates 4 of the memory cells is formed, each gate comprising a first gate dielectric layer 5, called tunnel oxide, a first conductive layer 6, for example of polysilicon, a second interpoly dielectric layer 7, which can be an oxide layer or the overlapping of more layers, for example ONO (oxide/nitride/oxide) and a second conductive layer 8, for example of polysilicon.

In these known configurations, pairs of adjacent memory cells share the same source region.

In the circuitry 3 a plurality of gates 9 of the HV transistors is instead formed. Each gate 9 of the HV transistors comprises, for example, a gate dielectric layer 7' and a conductive layer 8' of the circuitry 3. Advantageously, the gate dielectric layer 7' of the circuitry 3 and the conductive layer 8' of the circuitry 3 are formed, respectively, by the interpoly dielectric layer 7 and by the second conductive layer 8 used in the matrix 2.

After having carried out an oxidation step forming a protective film 9' on all the devices present on the semiconductor substrate 1, a first oxide layer 10 is then deposited. This first oxide layer 10 has the function of reducing the stress generated by the deposition of a successive nitride layer 11 on the gates 4 and 9. Moreover, the first oxide layer 10 serves as "stopping layer" in the etching step of the successive nitride layer 11.

The nitride layer 11 is then deposited on the whole semiconductor substrate 1 which will be used for the formation of spacers of the LV transistors of the circuitry 3 and of spacers of the matrix 2 cell. This nitride layer 11 completely fills the space present between pairs of memory cells in correspondence with the shared source region.

On the nitride layer 11 a second oxide layer 12 is also deposited which will be used for the formation of differential spacers, those of the HV transistors in the circuitry 3.

As shown in FIG. 2, an etching step in plasma blanket is carried out of the second oxide layer 12, selective with respect to the nitride layer 11 to form oxide spacers 13 above the nitride layer 11 aligned with the side walls of the gates 4, 9.

In particular in the matrix 2, since the source region shared by two adjacent cells is completely covered by the nitride layer 11, the spacers 13 are formed only on the side walls of pairs of gates 4 of memory cells.

As shown in FIG. 3, by means of a conventional photolithographic technique a first mask 14 is formed for the differential spacers 13. This mask 14 for the differential spacers completely covers the HV transistors of the circuitry 3.

As shown in FIG. 4, a removal step of the differential spacers 13 is then carried out in the areas left exposed by the mask 14, for example in the matrix 2 and in the LV transistors of the circuitry, to which a removal step of this mask 14 for the differential spacers follows.

With this process step the spacers 13 are completely removed from the matrix 2 and from the LV transistors of the circuitry, but the spacers 13 remain for the HV transistors of the circuitry 3.

As shown in FIG. 5, an etching step in plasma blanket of the nitride layer 11 is carried out. In particular this etching step is highly selective with respect to the first oxide layer 10.

With this etching step, short first nitride differential spacers 15 are formed on the side walls of the electrodes 9 in the matrix 2 and in the portion of circuitry 3 where the LV transistors are realized, while long second nitride differential spacers 16 are formed in the portion of circuitry 3 where the HV transistors are realized.

The HDD implants are then carried out in circuitry and if necessary in matrix.

At this point of the process as shown in FIG. 6, a pre-silicidation cleaning step is carried out for the removal of oxide layers 9', 10, if present.

A cobalt silicide layer is finally formed. In particular the silicide layer is formed in the matrix 2 in correspondence with the drain regions between the spacers 15 of corresponding pairs of memory cells.

The process is completed in a conventional way by means of the deposition of a borderless nitride layer and of the pre-metal dielectric layer, to which the definition and the formation of contacts is made follow.

Although advantageous under several aspects, this method shows some drawbacks.

In fact the continuous reduction of the sizes of memory devices involves the continuous decrease of the size of the cell drain and thus of the effective area for the drain contact in case devices are processed under alignment conditions close to the required specification limits and with a flow with borderless contacts wherein, thus, contacts can be self-aligned with the spacers.

This problem is generally complicated due to the need to form the spacers to define some source and drain regions of both Low Voltage (LV) and High Voltage (HV) transistors. The shape of the spacers in the matrix is, on the other hand, critical since it affects the deposition of the pre-metal dielectric risking to originate passing voids which would put the drain contacts in short. The size of the spacers is instead even more critical in the matrix since it reduces the size of the drain wherein the contacts are to be defined: in case of misalignment between contact mask and gate definition mask, the effective contact area is particularly reduced originating cell read/program problems due to the increase of the contact resistance. This problem is particularly evident in those process flows wherein nitride spacers and a borderless nitride layer are used under the pre-metal oxide to avoid the breaking of the field oxide in cases of misalignment of the contacts with respect to the active area. In this case the contact self-aligns to the spacer and thus in case of misalignment with respect to the gate definition mask, the contact area is particularly reduced.

BRIEF SUMMARY OF THE INVENTION

One embodiment of the present invention is a method for increasing the space available for the cell drain contact also in case of misalignment mask contacts towards the cell definition mask leaving however a dielectric layer to protect the cell wall, overcoming the drawbacks still limiting the processes realized according to the prior art. One embodiment of the method does so by reducing the length of the spacers in matrix.

One embodiment of the invention is directed to method for manufacturing non-volatile memory devices integrated on a semiconductor substrate and including a matrix of non-volatile memory cells and associated circuitry. The manufacturing method includes:

forming a plurality of gates of the matrix memory cells and a plurality of gates of transistors of the circuitry, coating, with at least one protection dielectric layer, the gates of the matrix and of the circuitry;

coating, with a first coating layer, the gates of the matrix and of the circuitry, the first coating layer being highly selective with respect to the protection dielectric layer;

forming an intermediate dielectric layer on the first coating layer;

forming a second coating layer on said intermediate dielectric layer, the second coating layer being highly selective with respect to said intermediate dielectric layer;

carrying out a first blanket etching step of the second coating layer, selective with respect to the intermediate dielectric layer, to form first coating spacers on the intermediate dielectric layer respectively aligned with side walls of the gates of the memory cells and second coating spacers on the intermediate dielectric layer respectively aligned with side walls of the gates of the circuitry;

shielding the gates of the transistors of the circuitry with a photo-lithographic mask;

carrying out a selective removal step of the second coating layer in areas left exposed by the photo-lithographic mask to completely remove the first coating spacers of the matrix;

removing the mask;

carrying out a blanket etching step of the intermediate dielectric layer until the first coating layer, covering an upper portion of the gates, is uncovered so as to form first dielectric spacers in the matrix and second dielectric spacers in the circuitry;

carrying out an etching step in plasma of the coating layers and of the second coating spacers, until the dielectric layers covering the gates on top are uncovered;

carrying out HDD implants in the circuitry;

carrying out a blanket etching step of the protection dielectric layer until upper portions of the gates are uncovered and the second dielectric spacers are removed and thus uncovering third coating spacers on the side walls of the gates of the memory cells and fourth coating spacers on the side walls of the gates of the circuitry, the fourth spacers being wider than the third spacers.

The characteristics and advantages of the device according to the invention will be apparent from the following description of an embodiment thereof given by way of indicative and non limiting example with reference to the annexed drawings.

BRIEF DESCRIPTION OF THE SEVERAL VIEWS OF THE DRAWING

In these drawings:

FIGS. 1 to 6 are respective section schematic views of a portion of integrated circuit during the successive manufacturing steps of a known method, FIGS. 7 to 13 are respective section schematic views of a portion of integrated circuit during the successive manufacturing steps of a method according to the present invention.

DETAILED DESCRIPTION OF THE INVENTION

With reference to the figures, a method is described for manufacturing non-volatile memory devices integrated on a semiconductor substrate 1 and comprising a matrix 2 of non-volatile memory cells 25 and associated circuitry 3.

The process steps described hereafter do not form a complete process flow for the manufacturing of integrated circuits. The present invention can be put into practice together with the techniques for manufacturing integrated circuits currently used in the field, and only those process steps being commonly used and necessary for the comprehension of the present invention are included.

The figures showing cross sections of portions of an integrated circuit during the manufacturing are not drawn to scale but they are instead drawn so as to show the important characteristics of the present invention.

In particular, the figures show a portion of a semiconductor substrate 1 where memory cells 25 of the memory matrix 2 and the HV transistors 26 of the circuitry 3 are realized, while the portion of a semiconductor substrate 1 where the LV transistors are realized is not shown.

As shown in FIG. 7, on a semiconductor substrate 1 after having defined active areas for the memory matrix 2 and for the circuitry 3, in the memory matrix 2 a plurality of floating gates 4 of the memory cells is formed each comprising a first gate dielectric layer 5, called tunnel oxide, a first conductive layer 6, for example of polysilicon, a second interpoly dielectric layer 7, which can be an oxide layer or the overlapping of more layers, for example ONO (oxide/nitride/oxide) and a second conductive layer 8, for example of polysilicon.

After forming the gates 4,9, the substrate 1 is doped according to known steps to form drain regions 27 and shared source regions 28. In an embodiment of the invention, as shown in the figures, pairs of adjacent memory cells share the same source region 28.

In the circuitry 3 a plurality of gates 9 of the HV transistors is instead formed. Each gate 9 of the HV transistors comprises, for example, a gate dielectric layer 7' and a conductive layer 8' of the circuitry 3. Advantageously, the gate dielectric layer 7' of the circuitry and the conductive layer 8' of the circuitry 3 are formed, respectively, by the interpoly dielectric layer 7 and by the second conductive layer 8 used in the matrix 2. After forming each gate 9, the method continues with doping of the substrate 1 to form source/drain regions 29 of the HV transistors, which may be performed simultaneously with the formation of the drain and source regions 27, 28 of the memory cells 25.

If the process needs it, all the devices present on the semiconductor substrate 1 are coated by a dielectric film 16 obtained by means of an oxidation step and by a protection dielectric layer 17, for example formed by means of deposition.

According to one embodiment of the invention a first coating layer 18 is then formed, for example of nitride, on the whole surface of the semiconductor substrate 1. This first coating layer 18 acts as "stopping layer" in the etching step of a layer which will be successively deposited.

Advantageously, the first coating layer 18 covers the gates 4 of the memory cells and of the circuitry 3, i.e. it does not completely fill the space comprised between pairs of adjacent gates sharing the same source region. However, in an alternative embodiment, this coating layer 18 fills it completely.

A further dielectric layer 19 is then formed, for example by means of deposition, on the whole semiconductor substrate 1 which will be used for the formation of spacers of the LV transistors of the circuitry 3 and of spacers of the matrix cells 25.

If the coating layer does not completely fill the space comprised between pairs of memory cells in correspondence with the shared source region, this further dielectric layer 19, for example of oxide, fills it completely.

A second coating layer 20, for example of nitride, is then formed, for example by means of deposition, which will be used for the formation of differential spacers, those of the HV transistors 26 in the circuitry 3.

As shown in FIG. 8, a first etching step in plasma blanket of the second coating layer 20 is carried out, selective with respect to the dielectric layer 19, to form spacers 20a and 20b on the dielectric layer 19 respectively aligned with the side walls of the gates of the memory cells 25 and of the circuitry transistors.

These spacers 20a are not formed on the side walls of the gates of the memory cells 25 which are aligned with the shared source region 28. In fact the space between the gates 4 and above the shared source region 28 is completely filled by the dielectric layer 19.

As shown in FIG. 9, by means of a conventional photolithographic technique, a mask 21 for the differential spacers is formed. This mask 21 completely covers the HV transistors 26 of the circuitry 3.

As shown in FIG. 10, a removal step of the coating layer 20 is then carried out in the areas left exposed by the mask 21 for the differential spacers. During this step the spacers 20a are completely removed from the matrix 2 and from the LV transistors of the circuitry 3 which are not covered by the mask 21, but the spacers 20b are left intact.

The mask 21 for the differential spacers is then removed.

As shown in FIG. 11 an etching step in plasma blanket is carried out of the dielectric layer 19 until the first coating layer 18 which covers the gates 4, 9 is uncovered. In particular, this etching step is highly selective with respect to the first coating layer 18.

With this etching step, short first dielectric spacers 19a are formed in the matrix 2 and in the portion of circuitry 3 where the LV transistors are realized, while long second oxide differential spacers 19b are formed in the portion of circuitry 3 where the HV transistors 26 are realized. In fact the dielectric layer 19, in the circuitry 3, is partially shielded by the spacers 20b of the coating layer and thus the oxide layer below these spacers 20b is not removed, forming longer spacers 19b compared to the spacers 19a.

As shown in FIG. 12 an etching step in plasma blanket is then carried out of the coating layers 18 and of the spacers 20b, until the dielectric layers 16 and 17 covering the gates 4, 9 are uncovered. Such etching leaves spacers 18a, 18b on the side walls of the gates 4, 9 of the memory cells 25 and HV transistors 26, respectively.

Dopant implanting then carried out to form HDD implants 30 in circuitry 3 and if necessary in matrix 2.

At this point of the process as shown in FIG. 13, a pre-silicidation cleaning step is carried out for the removal of dielectric layers 16, 17 and the spacers 19a, 19b.

By means of this step the upper portion of the gates 4 and 9 is uncovered and spacers 18a and 18b remain uncovered on the side walls of the gates 4 and 9.

Thus with the method described above, in matrix coating spacers 18a are formed being shorter with respect to the spacers 18b formed in circuitry 3.

A cobalt silicide layer 31 is finally formed. In particular the silicide layer 31 is formed in the matrix 2 in correspondence with the drain region between one spacer 18a and the other.

The process is completed by means of the deposition of a borderless nitride layer covering the whole structure formed up to this process step, and of the pre-metal dielectric layer so as to insulate the cells of the matrix from one another.

According to the method described above, the silicide contacts 31 are no more self-aligned with the oxide spacers 15a as in the prior art, but they are realized adjacent to the coating spacers 18a which are much narrower in the matrix, thus the active area on the basis of the drain region contact is wide enough so as to have a good contact resistance.

In conclusion, the method allows one to reduce the length of the spacers in matrix so as to reduce the marginality of the drain contact area causing a minimal impact on the source and drain regions of the cell and of the circuitry transistors.

The process can be advantageously applied for example to memories of the EPROM, EEPROM, flash EEPROM type, but, more in general, it is applied to each type of process with differential spacers, i.e. to all the CMOS processes for advanced applications of the "system on chip" type.

All of the above U.S. patents, U.S. patent application publications, U.S. patent applications, foreign patents, foreign patent applications and non-patent publications referred to in this specification and/or listed in the Application Data Sheetare incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for manufacturing non-volatile memory devices integrated on a semiconductor substrate and including a matrix of non-volatile memory cells and associated circuitry, the manufacturing method comprising the following steps:
    forming a plurality of gates of the matrix memory cells, each gate including a first dielectric layer, a first conductive layer, a second dielectric layer and a second conductive layer;
    forming a plurality of gates of transistors of said circuitry each gate of said circuitry transistors including a first dielectric layer and a first conductive layer,
    coating, with at least one protection dielectric layer, said gates of the matrix and of the circuitry;
    coating, with a first coating layer, said gates of the matrix and of the circuitry, said first coating layer being highly selective with respect to said protection dielectric layer;
    forming an intermediate dielectric layer on the first coating layer;
    forming a second coating layer on said intermediate dielectric layer, said second coating layer being highly selective with respect to said intermediate dielectric layer;
    carrying out a first blanket etching step of the second coating layer, selective with respect to the intermediate dielectric layer, to form first coating spacers on the intermediate dielectric layer respectively aligned with side walls of said gates of the memory cells and second coating spacers on the intermediate dielectric layer respectively aligned with side walls of said gates of the circuitry;
    shielding said gates of said transistors of the circuitry with a photo-lithographic mask;
    carrying out a selective removal step of the second coating layer in areas left exposed by the photo-lithographic mask to completely remove said first coating spacers of the matrix;
    removing said mask;
    carrying out a blanket etching step of the intermediate dielectric layer until said first coating layer, covering an upper portion of said gates, is uncovered so as to form first dielectric spacers in the matrix and second dielectric spacers in the circuitry;
    carrying out an etching step in plasma of the coating layers and of the second coating spacers, until the dielectric layers covering the gates on top are uncovered;
    carrying out HDD implants in the circuitry;
    carrying out a blanket etching step of the protection dielectric layer until upper portions of said gates are uncovered and the second dielectric spacers are removed and thus uncovering second coating spacers on the side walls of said gates of the memory cells and third coating spacers on the side walls of said gates of the circuitry, said third coating spacers being wider than said second coating spacers.

2. The manufacturing method according to claim 1, wherein said first and second coating layers are made of a nitride layer.

3. The manufacturing method according to claim 1, wherein said intermediate dielectric layer is made of an oxide layer.

4. The manufacturing method according to claim 1, wherein said intermediate dielectric layer completely fills space between two gates of pairs of adjacent cells sharing a same source region.

5. The manufacturing method according to claim 1, wherein said blanket etching steps are realized by etchings in plasma.

6. A method of manufacturing a non-volatile memory device, comprising:
    forming a gate of a first transistor on a semiconductor substrate;
    forming a gate of a second transistor on the semiconductor substrate,
    coating the gates with a protection dielectric layer;
    coating, with a first coating layer, the gates and the protection dielectric layer, first coating layer being highly selective with respect to the protection dielectric layer;
    forming an intermediate dielectric layer on the first coating layer;
    forming a second coating layer on the intermediate dielectric layer, the second coating layer being highly selective with respect to the intermediate dielectric layer;
    blanket etching the second coating layer to form first coating spacers on the intermediate dielectric layer and along side walls of the gates of the first and second transistors;
    shielding the gate of the second transistor with a mask;
    removing the first coating spacers along the side walls of the first transistor;
    removing the mask;
    blanket etching the intermediate dielectric layer until the first coating layer is uncovered so as to form first dielectric spacers along the side walls of the first transistor and second dielectric spacers along the side walls of the second transistor;
    etching the first coating spacers and the first coating layer to form second coating spacers along the side walls of the first transistor and third coating spacers along the sidewalls of the second transistor;
    implanting in the substrate an HDD implant for the second transistor;
    blanket etching the protection dielectric layer until upper portions of the gates are uncovered and the second dielectric spacers are removed, thereby uncovering the second coating spacers along the side walls of the gate of the first transistor and the third coating spacers along the side walls of the gate of the second transistor.

7. The method of claim 6, wherein the first and second coating layers are made of a nitride layer.

8. The method of claim 6, wherein the intermediate dielectric layer is made of an oxide layer.

9. The method of claim 6, wherein the first transistor is a memory cell transistor and the second transistor is a high voltage transistor.

10. The method of claim 6 wherein the first transistor is a first memory cell transistor, the method further comprising:

forming a gate of a second memory cell transistor on the semiconductor substrate, wherein the intermediate dielectric layer completely fills space between the gates of the first and second memory cell transistors.

11. The method of claim 6, wherein the blanket etching steps employ plasma etching.

12. A method of manufacturing a non-volatile memory device, comprising:

forming a gate of a first transistor on a semiconductor substrate;

forming a gate of a second transistor on the semiconductor substrate, forming first coating spacers along side walls of the gate of the second transistor;

forming first dielectric spacers along side walls of the first transistor and second dielectric spacers between the first coating spacers and the gate of the second transistor;

removing the first coating spacers after forming the second dielectric spacers;

forming second coating spacers between the first dielectric spacers and the side walls of the gate of the first transistor and third coating spacers between the second dielectric spacers and the side walls of the gate of the second transistor;

implanting in the substrate an HDD implant for the second transistor after forming the second and third coating spacers;

removing the first and second dielectric spacers.

13. The method of claim 12, wherein the first and second coating spacers are made of a nitride.

14. The method of claim 12, wherein the first and second dielectric spacers are made of an oxide.

15. The method of claim 12, wherein the first transistor is a memory cell transistor and the second transistor is a high voltage transistor.

16. The method of claim 12 wherein the first transistor is a first memory cell transistor, the method further comprising:

forming a gate of a second memory cell transistor on the semiconductor substrate, wherein the first dielectric spacers and the second coating spacers completely fill space between the gates of the first and second memory cell transistors.

17. The method of claim 12, wherein the dielectric and coatings spacers are formed using plasma etching.

* * * * *